United States Patent
Patlolla et al.

(10) Patent No.: US 10,373,909 B2
(45) Date of Patent: Aug. 6, 2019

(54) SELECTIVE SURFACE MODIFICATION OF INTERCONNECT STRUCTURES

(71) Applicant: International Business Machines Corporation, Armonk, NY (US)

(72) Inventors: Raghuveer R. Patlolla, Guilderland, NY (US); Cornelius Brown Peethala, Albany, NY (US); Roger A. Quon, Rhinebeck, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 6 days.

(21) Appl. No.: 15/724,367

(22) Filed: Oct. 4, 2017

(65) Prior Publication Data

US 2018/0082955 A1 Mar. 22, 2018

Related U.S. Application Data

(62) Division of application No. 15/268,787, filed on Sep. 19, 2016, now Pat. No. 9,859,218.

(51) Int. Cl.
*H01L 23/522* (2006.01)
*H01L 23/532* (2006.01)
*H01L 21/768* (2006.01)

(52) U.S. Cl.
CPC .. *H01L 23/53238* (2013.01); *H01L 21/76849* (2013.01); *H01L 21/76883* (2013.01)

(58) Field of Classification Search
CPC .......... H01L 23/5226; H01L 23/53238; H01L 21/76829; H01L 21/76832; H01L 21/76883; H01L 21/76865; H01L 21/7685; H01L 21/76843; H01L 21/76802; H01L 21/7684
See application file for complete search history.

(56) References Cited

U.S. PATENT DOCUMENTS

| | | | | | |
|---|---|---|---|---|---|
| 4,749,548 | A | * | 6/1988 | Akutsu | ............. H01L 23/49579 257/E23.053 |
| 2003/0008495 | A1 | * | 1/2003 | Hsue | ................. H01L 21/76838 438/627 |
| 2004/0238963 | A1 | * | 12/2004 | Fujisawa | ........... H01L 21/76843 257/758 |

(Continued)

OTHER PUBLICATIONS

List of IBM Patents or Patent Applications Treated as Related; (Appendix P), Date Filed Oct. 5, 2017; 2 pages.

(Continued)

*Primary Examiner* — Cuong Q Nguyen
(74) *Attorney, Agent, or Firm* — Cantor Colburn LLP; Vazken Alexanian

(57) ABSTRACT

Semiconductor structures including copper interconnect structures and methods include selective surface modification of copper by providing a $Cu_xTi_yN_z$ alloy in the surface. The methods generally include forming a titanium nitride layer on an exposed copper surface followed by annealing to form the $Cu_xTi_yN_z$ alloy in the exposed copper surface. Subsequently, the titanium layer is removed by a selective wet etching.

13 Claims, 5 Drawing Sheets

(56) References Cited

U.S. PATENT DOCUMENTS

| 2007/0018329 A1* | 1/2007 | Oh ................... H01L 21/76832 |
| | | 257/762 |
| 2014/0061914 A1* | 3/2014 | Dyer ................ H01L 23/53238 |
| | | 257/751 |
| 2014/0117558 A1* | 5/2014 | Boyanov ............ H01L 23/5226 |
| | | 257/774 |

OTHER PUBLICATIONS

Patlolla, et al., Pending U.S. Appl. No. 15/268,787 entitled "Selective Surface Modification of Interconnect Structures," filed Sep. 19, 2016.

* cited by examiner

SELECTIVE SURFACE MODIFICATION OF INTERCONNECT STRUCTURES

DOMESTIC PRIORITY

This application is a DIVISIONAL of U.S. application Ser. No. 15/268,787, filed Sep. 19, 2016, the contents of which are incorporated by reference herein in its entirety.

BACKGROUND

The present invention generally relates to semiconductor integrated circuits, and more particularly, to the structure and formation of copper interconnects with improved electromigration and wet etch resistance.

An integrated circuit (IC) generally includes a semiconductor substrate in which a number of device regions are formed by diffusion or ion implantation of suitable dopants. This substrate usually involves a passivating and an insulating layer required to form different device regions. The total thickness of these layers is usually less than one micron. Openings through these layers (called vias or contact holes) and trenches therein allow electrical contact to be made selectively to underlying device regions. A conducting material such as copper is used to fill these holes, which then make contact to metallization layers and/or semiconductor devices.

SUMMARY

In one or more embodiments, a method for forming an interconnect structure in a semiconductor substrate includes forming at least one opening extending through an interlayer dielectric to form a patterned interlayer dielectric. Copper is deposited into the at least one opening and forms an overburden on the interlayer dielectric. The substrate is planarized to the interlayer to remove the overburden, wherein a top surface of the copper is coplanar to a top surface of the interlayer dielectric. A titanium nitride layer is deposited on the coplanar top surfaces of the copper and the interlayer dielectric, and the semiconductor structure annealed. Annealing the semiconductor structure forms a $Cu_xTi_yN_z$ alloy in the top surface of the copper, wherein $0<x<1$, $0<y<1$, and $0≤z<1$. The titanium nitride layer is removed.

In one or more other embodiments, a method for selectively modifying a copper surface includes depositing copper onto a semiconductor substrate, wherein depositing the copper includes an electrodeposition process, wherein the copper has a planar top surface. A titanium nitride is deposited onto the planar top surface of the copper. The copper is annealed at a temperature with the range of from about 100° C. to about 500° C. for a period of time with the range of from about 20 minutes to about 4 hours. The annealing forms a $Cu_xTi_yN_z$ alloy in the top planar surface of the copper, wherein $0<x<1$, $0<y<1$, and $0≤z<1$. The titanium nitride layer is removed using, for example, an etch process selective to the copper.

In one or more embodiments, a semiconductor structure includes at least one copper interconnect structure filled with copper in an interlayer dielectric. The at least one copper interconnect structure includes a $Cu_xTi_yN_z$ alloy in a top surface of the copper, wherein $0<x<1$, $0<y<1$, and $0≤z<1$.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
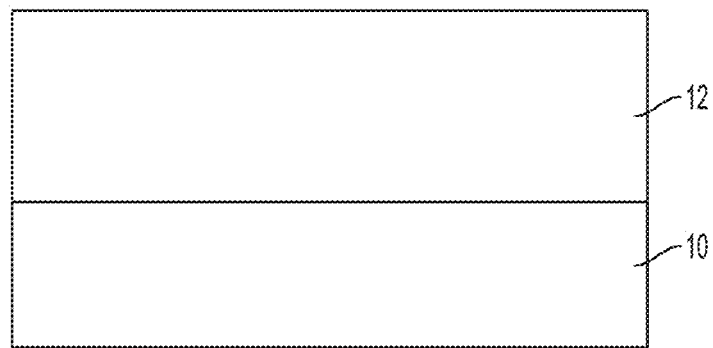
FIG. 1 depicts a portion of a semiconductor substrate including an interlayer dielectric overlying semiconductor substrate in accordance with one or more embodiments.

The detailed description explains the preferred embodiments of the invention, together with advantages and features, by way of example with reference to the drawings.

DETAILED DESCRIPTION

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As previously noted herein, an IC generally includes a semiconductor substrate in which a number of device regions are formed. This substrate usually involves a passivating and an insulating layer required to form different device regions. The total thickness of these layers is usually less than one micron. Openings through these layers (called vias or contact holes) and trenches therein allow electrical contact to be made selectively to underlying device regions. A conducting material such as copper is used to fill these holes, which then make contact to metallization layers and/or semiconductor devices. The openings are typically lined with a liner material, i.e., a barrier layer, to prevent migration of the conducting material into the dielectric material, which can lead to electrical short circuits, rendering the circuit unusable Damascene processing is a method often employed for forming interconnect structures on integrated circuits. It involves formation of inlaid metal lines in trenches and vias formed in a dielectric layer (inter layer dielectric). Damascene processing is often a preferred method because it requires fewer processing steps than other methods and offers a higher yield. It is also particularly well-suited to metals such as copper that cannot be readily patterned by plasma etching.

In a typical damascene process flow, metal is deposited onto a patterned dielectric to fill the vias and trenches formed in the dielectric layer. The resulting metallization layer is typically formed either directly on a layer carrying active devices, or on a lower-lying metallization layer. A thin layer of a dielectric diffusion barrier material is deposited between adjacent metallization layers to prevent diffusion of metal into bulk layers of dielectric. In some cases, the silicon carbide or silicon nitride dielectric diffusion barrier layer also serves as an etch stop layer during patterning of inter layer dielectric (ILD).

In a typical integrated circuit (IC), several metallization layers are deposited on top of each other forming a stack, where metal-filled vias and trenches serve as conducting paths. The conducting paths of one metallization layer are connected to the conducting paths of an underlying or overlying layer by a series of interconnects.

One challenging problem encountered during IC fabrication is electromigration failure. Electromigration occurs when high current densities experienced by an interconnect lead to migration of metal atoms with the current, and, consequently, lead to formation of voids within interconnects. Ultimately, formation of voids can lead to failure of the device, known as electromigration failure. During ongoing miniaturization of IC devices, interconnect dimensions are decreased, and larger current densities are experienced by interconnects. As a consequence, the probability of electromigration failure increases with such device miniaturization.

Electromigration failure has been attributed to the following causes. First, the copper surface can be oxidized easily upon exposure to air or trace amounts of oxygen to form copper oxide. However, copper oxide has a relatively weak bond energy (<200 kJ/mol) in comparison to other oxides such as $SiO_2$, $Al2O_3$, or $TiO_2$ (>300 kJ/mol). Further, there is poor interfacial bonding energy and therefore poor adhesion between dielectric copper diffusion barrier layer (e.g., SiN, SiC, or SiCN) and copper line. Poor adhesion has been attributed to the presence of surface copper oxide and/or weaker cohesive strength between dielectric diffusion barrier materials (e.g., SiN, SiC, or SiCN) and copper as compared to copper-metal interactions.

The present invention generally provides copper interconnect structures and processes for forming the copper interconnect structures. The structures and processes generally include selective surface modification of the exposed copper surfaces, which in addition to the liner layer provides the copper interconnect structure with effective electromigration resistance and also provides the modified copper surface with wet etch resistance during subsequent processing.

Turning now to a more detailed description of embodiments of the present invention, FIG. 1 depicts a portion of a semiconductor substrate 10, which can include various devices therein, for example, transistors, diodes, other semiconductor elements as well known in the art, and other metal contacts or interconnect layers.

An interlayer dielectric 12 is formed overlying the semiconductor substrate 10. Interlayer dielectric layer 12 can be one of a number of different dielectric materials commonly used in integrated circuit fabrication. For example, dielectric layer 12 can be silicon dioxide, silicon nitride, or a doped glass layer, such as phosphorus silicate glass, boron silicate glass, and the like. In other embodiments, the dielectric layer can be a low k dielectric layer, wherein low k generally refers to materials having a dielectric constant less than silicon dioxide. Exemplary low k dielectric materials include, without limitation, SILK® from Dow Chemical, Coral® from Novellus, Black Diamond® from Applied Materials, and spin on dielectrics can be used. Coral® can be described generically as a SiCOH dielectric. Depending upon the particular dielectric material, dielectric layer 12 can be formed by chemical vapor deposition deposited (CVD), plasma enhanced chemical vapor deposition (PECVD), atmospheric deposition as well as spin on techniques. In one or more embodiments, dielectric layer 12 is a chemical vapor deposited material, such as silicon dioxide or silicon nitride, which has been deposited over a planarized dielectric layer.

Figure 2:
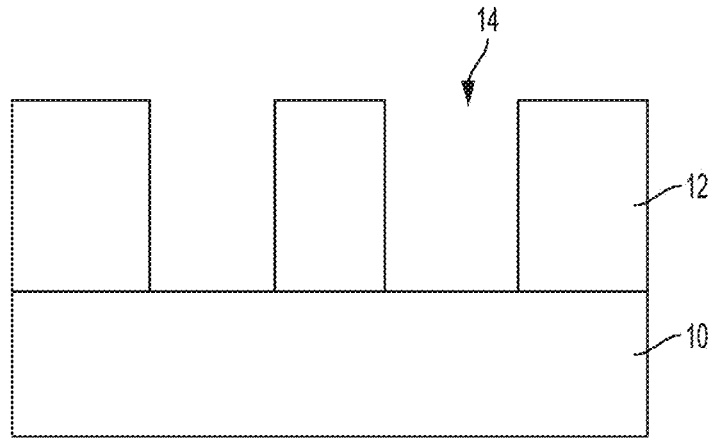
FIG. 2 depicts the semiconductor substrate following photolithographic patterning of the interlayer dielectric to form openings therein.

Once the dielectric layer 12 has been deposited, openings 14 such as trench and/or via features are next photolithographically patterned into the dielectric layer 12 as shown in FIG. 2. Photolithography can include forming trilayer of organic dielectric layer (ODL), silicon anti reflective coating (SiARC), and a photoresist (not shown) onto at least the dielectric surfaces where openings are desired, exposing the photoresist to a pattern of activating radiation, and then developing the exposed photoresist with a resist developer to provide a patterned photoresist. At least one etch process can be employed to transfer the pattern from the patterned photoresist into the dielectric layer 121 and form the opening 14. The etching process can be a dry etch (e.g., reactive ion etching, plasma etching, ion beam etching, or laser ablation) and/or a wet chemical etch (e.g., potassium hydroxide (KOH)). After transferring the pattern, the patterned photoresist is removed utilizing resist stripping processes, for example, ashing.

Figure 3:
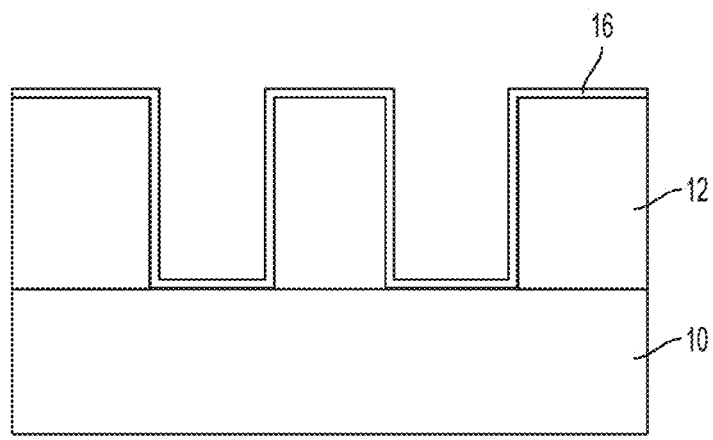
FIG. 3 depicts the semiconductor substrate following conformal deposition of a metal liner layer.

In FIG. 3, a metal liner layer 16, i.e., barrier layer, is then conformally deposited to the patterned dielectric layer 12. For example, tantalum, tantalum nitride, cobalt, ruthenium, titanium nitride, and combinations of more than one material (for example tantalum nitride/tantalum or tantalum nitride/cobalt). The presence of the barrier layer 16 such as titanium nitride, for example, insures that copper, which is participating in the interdiffusion during subsequent annealing processes, will not further diffuse into underlying dielectric layers.

Next, an optional conformal seed layer (not shown) is deposited. The function of the seed layer is to provide a base upon which a copper conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering. In the case of a dual damascene process, the seed layer can be deposited on an underlayer disposed in a via within a dielectric material.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Figure 4:
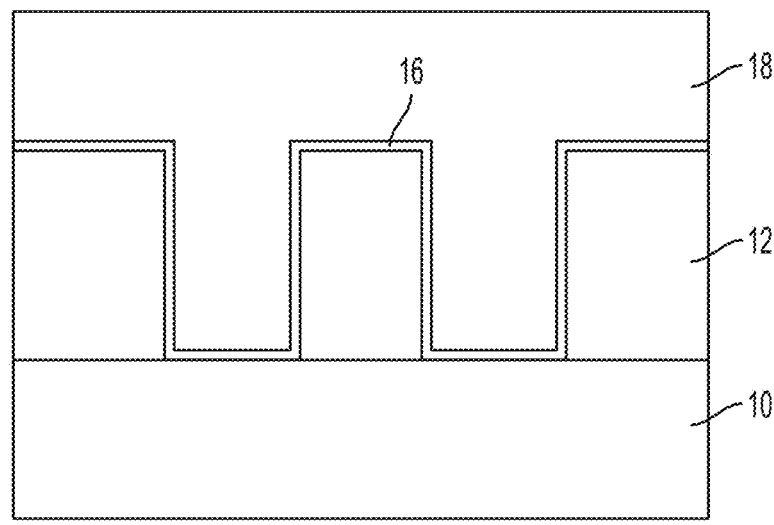
FIG. 4 depicts the semiconductor substrate following deposition of copper.

Following deposition of the seed layer, a layer of copper 18 is then deposited as shown in FIG. 4. In some structures, the copper metal layer can include an alloying element such as C, N, O, Cl or S, which have been shown to improve the reliability of the copper conductor. The amount of alloying element in the copper alloy is typically in the range of about 0.001 weight percent (wt. %) to about 10 wt %.

The copper layer 18 can be formed by CVD, sputtering, electrochemical deposition or like processes. For example, the deposition of copper can proceed by electrochemical deposition such as electroplating or electroless plating. Examples of suitable copper electroplating compositions are described in U.S. Pat. No. 6,911,229 assigned to International Business Machines Corporation, the entire description of which is incorporated by reference in its entirety.

Figure 5:
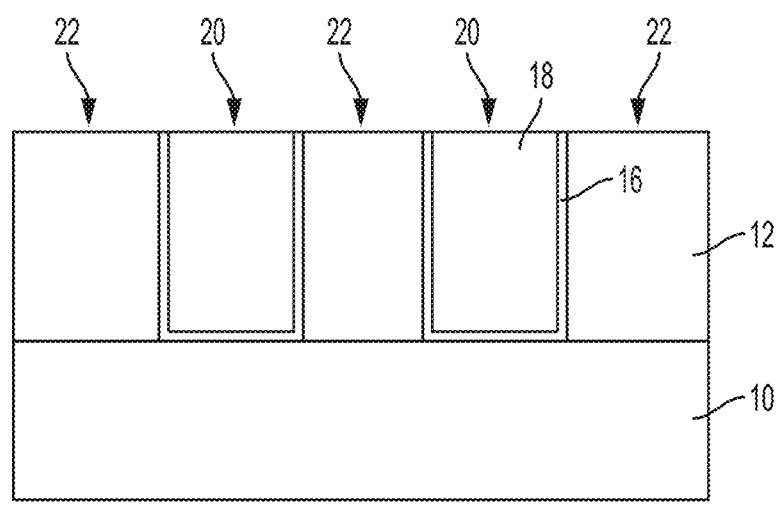
FIG. 5 depicts the semiconductor substrate following a planarization process to remove copper overburden such that a top surface of the copper is substantially coplanar to the interlayer dielectric.

As shown in FIG. 5, following formation of copper metal layer 18, the substrate 10 is subjected to a planarization process to remove the copper overburden such that a top surface of the copper is substantially coplanar to the low k dielectric layer and form the damascene structure. For example, the surface can be planarized using an electropolishing process. In an electropolishing process small amounts of copper are etched from the copper by electroetch or electrochemical etching to provide a copper interconnect having a top copper surface 20 generally coplanar to the top surface 22 of the dielectric. Such a structure is often referred to as a recessed structure. In another embodiment, the planar surface is formed by chemical-mechanical-polishing (CMP), using a non-selective slurry composition. The slurry composition contains a silica abrasive material, which removes the different metal layers at substantially the same rate. Alternatively, a planar surface can be formed by a non-selective plasma etching process. The plasma etching process can include additional planarizing layers deposited onto copper layer. For example, a layer of photoresist can be deposited onto copper layer prior to performing the non-selective etch process.

Figure 6:
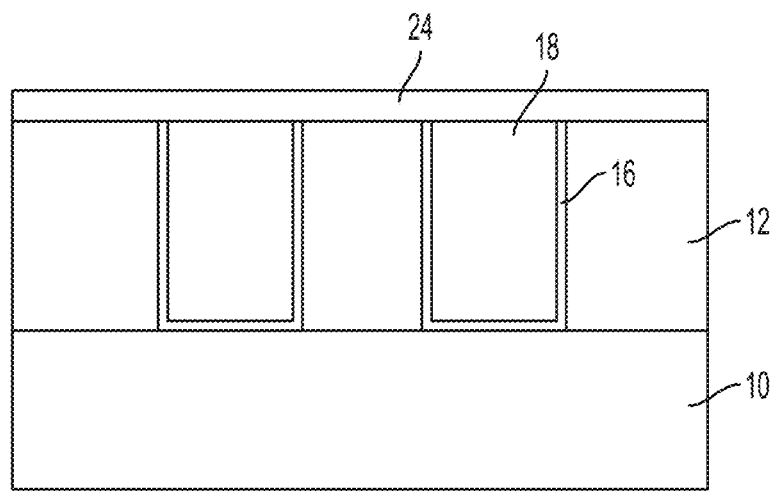
FIG. 6 depicts the semiconductor substrate following deposition of a titanium nitride capping layer.

In FIG. 6, a titanium nitride cap layer 24 is deposited onto the planar surface defined by the top surface 20 of the copper 18 and the top surface 22 of the dielectric 12. The titanium nitride cap layer 24 can be deposited by PVD, sputtering, or the like, often from a titanium metal target in a nitrogen-containing atmosphere. The thickness of the titanium nitride cap layer 24 can be between 1 Angstrom and 1000 Angstroms or more. In one or more embodiments, the thickness of the titanium nitride cap layer is 50 Angstroms to 500 Angstroms, and in still one or more other embodiments, the thickness of the titanium nitride cap layer is 100 to 400 Angstroms. By way of example, the titanium nitride layer can be 250 Angstroms.

Figure 7:
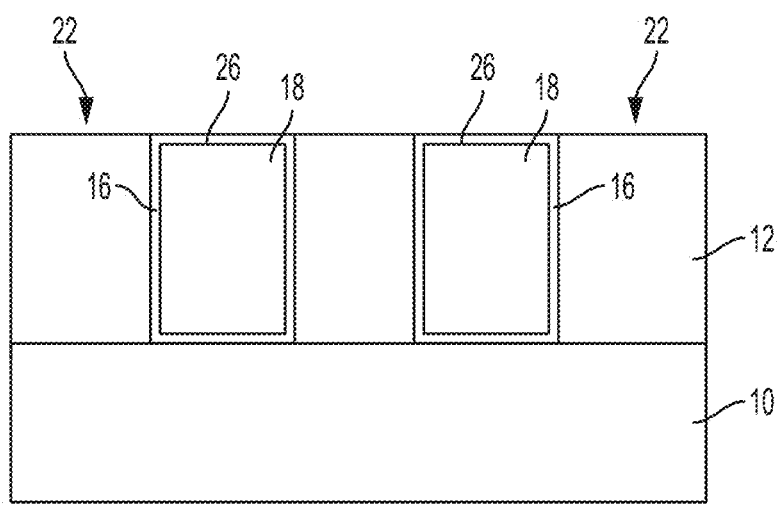
FIG. 7 depicts the semiconductor substrate following an annealing process and a wet etch process to remove the titanium nitride cap layer.

Referring now to FIG. 7, following deposition of the titanium nitride layer 20, the substrate device 10 is first subjected to an annealing process followed by a wet etch process to remove the titanium nitride cap layer 24. As is understood, annealing causes copper recrystallization and grain growth to produce larger grains structures than that originally deposited. In addition, it has been advantageously discovered that a portion of the titanium nitride cap layer 24 reacts with the underlying copper 18 to form a $Cu_xTi_yN_z$ alloy 26 in uppermost surface of the copper 18.

Exemplary annealing processes include furnace anneal or the like. The furnace anneal generally includes heating the semiconductor device 10 at a temperature within a range from about 100° C. to about 500° C. for a period of time of about 20 minutes to about 4 hours.

Following the annealing process, the unreacted titanium nitride layer 20 is removed. In one or more embodiments, the titanium nitride layer can be removed by wet etching. The wet etching chemistry is selective to the copper alloy and dielectric surface and is not intended to be limited. Exemplary wet etchant chemistries include, but are not limited to, a mixture of ammonium hydroxide, an azole type compound such as benzotriazole with hydrogen peroxide, which is also known as APM or SC-1, a mixture of hydrogen peroxide, organic onium hydroxide compound and an acid such as described is US Pat. Pub. No. 2006/0226122, incorporated by reference in its entirety, or the like. Typical APM solutions include, for example, a ratio of $NH_4OH:H_2O_2:H_2O=1:1:5$. Typical SPM solutions include, for example, a ratio of $H_2SO_4:H_2O_2=1:5$. The substrate is exposed to the wet etchant for a period of time (typically, about 0.5 minutes to about 5 minutes) and at a temperature (about 25° C. to about 70° C.) effective to etch the titanium nitride selectively relative to the surrounding structures, e.g., the copper alloy and dielectric surfaces. Other wet etchants for removing the unreacted titanium nitride layer are described in US Pat. Pub. No. 2013/0200040 incorporated by reference in its entirety.

As previously noted above, the resulting interconnect structure includes a liner layer about the sidewalls and bottom surface trench/via features, which provides lateral electromigration resistance of the copper filled trench/via features and a top surface 26 of the formed of a $Cu_xTi_yN_z$ alloy, wherein $0<x<1$, $0<y<1$, and $0\leq z<1$. The $Cu_xTi_yN_z$ alloy acts as a cap layer post plating and planarization, thereby providing protection as well as preventing electromigration during subsequent processing. $Cu_xTi_yN_z$ alloy is not removed during the wet etch process.

In one or more other embodiments, the titanium nitride layer is removed by dry etching. By way of example, the titanium nitride layer can be removed by reactive ion etching.

Figure 8:
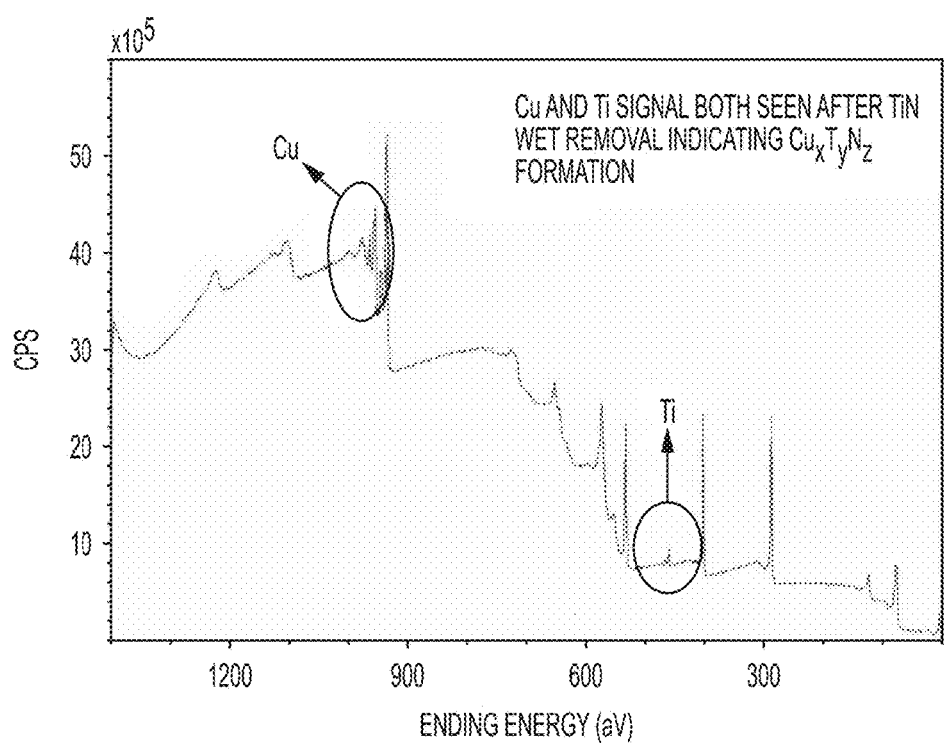
FIG. 8 graphically illustrates signals from both copper and titanium after the wet etch removal process as measured at the surface by X-ray photoelectron spectroscopy (XPS)

Referring now to FIG. 8, there is graphically illustrated signals from both copper and titanium after wet etch removal of the titanium nitride cap layer as measured at the surface by X-ray photoelectron spectroscopy (XPS). The presence of both copper and titanium is indicative of $Cu_xTi_yN_z$ formation. In this example, copper was electroplated onto a patterned dielectric layer. Surface chemistry was analyzed using inline 300 mm XPS to provide a baseline. A titanium nitride layer was then deposited at a thickness of 250 Angstroms onto the copper surface. The structure was then subjected to a furnace annealing process followed by a wet etch to remove the titanium nitride layer. A post wet etch inline 300 mm XPS was then utilized to analyze the top surface of the copper layer subsequent to titanium nitride removal. As shown, signals for both copper and titanium were evident after the titanium nitride wet removal indicating $Cu_xTi_yN_z$ formation.

Figure 9:
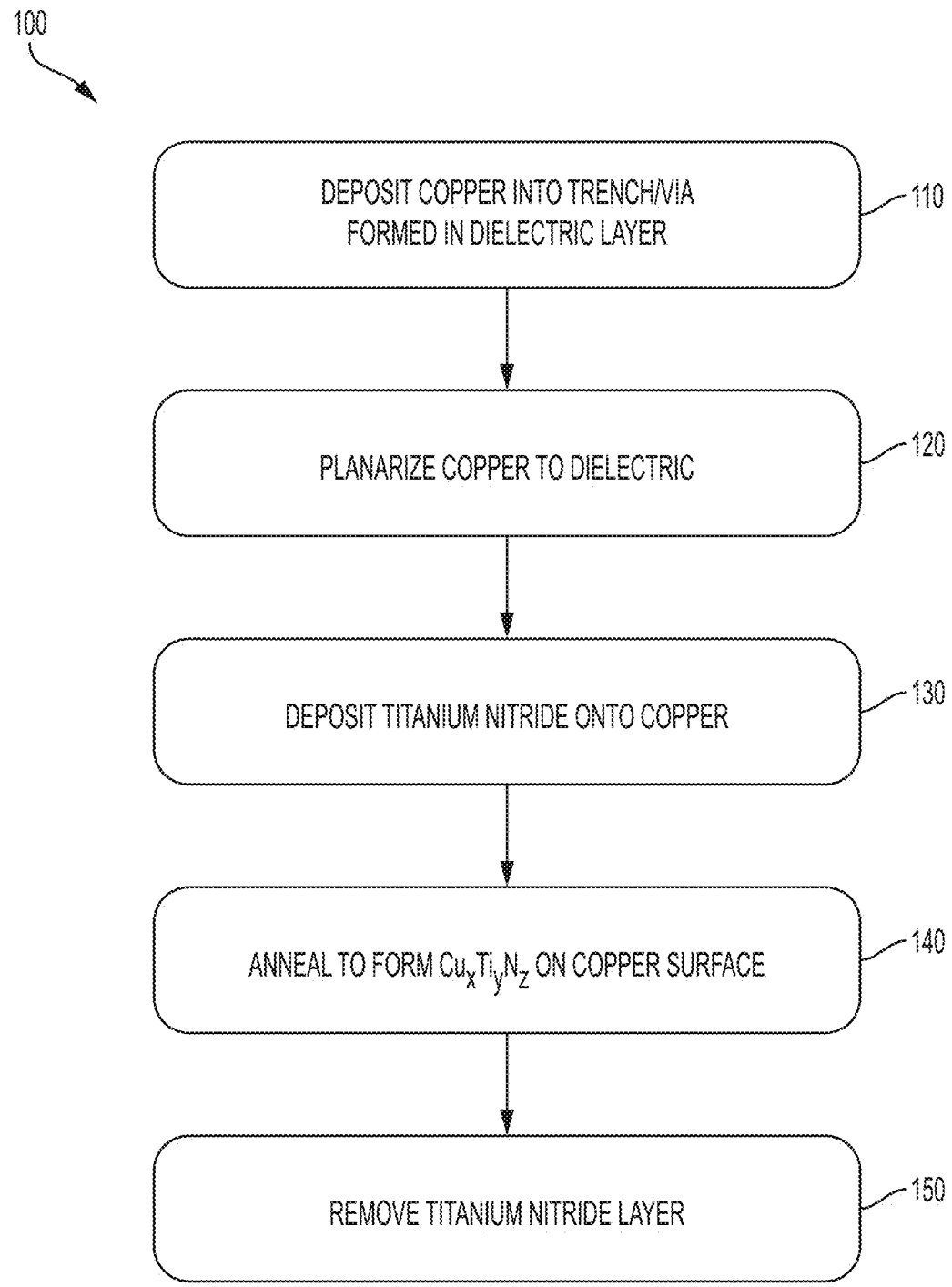
FIG. 9 schematically illustrates the process flow for forming $Cu_xTi_yN_z$ on a top surface of a copper interconnect structure.

The process for forming the $Cu_xTi_yN_z$ alloy, generally designated by reference numeral 100, is schematically shown in FIG. 9. The process as shown at step 110 generally beings with pattering the dielectric surface and filling the openings defining the interconnect structure with copper. At step 120, the copper overburden is then removed by planarization to the dielectric surface such that the copper top surface is coplanar to the dielectric top surface. At step 130, a titanium nitride layer is deposited onto the coplanar surfaces of the copper and the dielectric. At step 140, the substrate is subjected to an annealing process to provide the desired microstructure to the copper. As previous discussed, annealing the substrate with the titanium nitride layer in direct contact with the copper results in the formation of a $Cu_xTi_yN_z$ alloy in an uppermost surface of the copper. At step 150, the titanium layer is removed using a wet etch process selective to the dielectric and the $Cu_xTi_yN_z$ alloy. As such, the process 100 provides selective modification of the top surface of the copper, which provides further electromigration resistance and protects the copper layer during subsequent processing to complete the integrated circuit device, e.g., subsequent process for definition of via interconnects, protection during airgap features, or the like.

While the present invention has been described in terms of specific embodiments, it is evident in view of the foregoing description that numerous alternatives, modifications and variations will be apparent to those skilled in the art. Each of the various embodiments of the present invention can be implemented alone, or in combination with any other embodiments of the present invention unless expressly described otherwise or otherwise impossible as would be known to one of ordinary skill in the art. Accordingly, the present invention is intended to encompass all such alternatives, modifications and variations which fall within the scope and spirit of the present invention and the following claims.

What is claimed is:

1. A semiconductor structure comprising:
at least one copper interconnect structure filled with copper in an interlayer dielectric, the at least one copper interconnect structure comprising a $Cu_xTi_yN_z$ alloy in a top surface of the copper, wherein $0<x<1$, $0<y<1$, and $0\leq z<1$, wherein the $Cu_xTi_yN_z$ alloy in the top surface is free of TiN thereon.

2. The semiconductor structure of claim 1, wherein the at least one copper interconnect structure further comprises a liner layer on surfaces between the at least one copper interconnect structure and the interlayer dielectric.

3. The semiconductor structure of claim 1 further comprising a liner layer intermediate the copper and the interlayer dielectric formed of a material comprising tantalum, titanium, tantalum nitride or titanium nitride.

4. The semiconductor structure of claim 1, wherein the top surface of the copper is coplanar to a top surface of the interlay dielectric.

5. The semiconductor structure of claim 1, wherein the copper includes an alloying element comprising C, N, O, or Cl.

6. The semiconductor structure of claim 1, wherein the copper further comprises an amount of an alloying element is in the range of about 0.001 weight percent (wt. %) to about 10 wt % of the copper.

7. The semiconductor structure of claim 1, wherein the interlayer dielectric comprises silicon dioxide, silicon nitride, or a doped glass layer, such as phosphorus silicate glass, or boron silicate glass.

8. The semiconductor structure of claim 3, wherein the liner layer comprises tantalum, tantalum, nitride, cobalt, ruthenium, titanium nitride, or combinations thereof.

9. The semiconductor structure of claim 2, further comprising a seed layer on the liner layer, the seed layer comprising one or more metals.

10. The semiconductor structure of claim 9, wherein the seed layer comprising the one or more metals is from 1 atomic percent to 10 atomic percent.

11. The semiconductor structure of claim 9, wherein the seed layer comprises copper or copper manganese.

12. The semiconductor structure of claim 9, wherein the seed layer comprising the one or more metals is from 1 atomic percent to 7 atomic percent.

13. The semiconductor structure of claim 5, wherein the alloying element is from 0.001 weight percent to 10 weight percent.

* * * * *